United States Patent
Do

(10) Patent No.: US 7,388,797 B2
(45) Date of Patent: Jun. 17, 2008

(54) SEMICONDUCTOR MEMORY DEVICE

(75) Inventor: Chang-Ho Do, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 128 days.

(21) Appl. No.: 11/524,211

(22) Filed: Sep. 21, 2006

(65) Prior Publication Data

US 2007/0070675 A1 Mar. 29, 2007

(30) Foreign Application Priority Data

Sep. 28, 2005 (KR) .................. 10-2005-0090859
May 30, 2006 (KR) .................. 10-2006-0049005

(51) Int. Cl.
*G11C 7/00* (2006.01)

(52) U.S. Cl. .................. 365/201; 365/189.01; 365/195

(58) Field of Classification Search ............... 365/201, 365/189.01, 195, 189.08
See application file for complete search history.

(56) References Cited

U.S. PATENT DOCUMENTS 5,598,341 A   1/1997 Ling et al.
5,657,292 A * 8/1997 McClure ................ 365/233.16
6,499,120 B1  12/2002 Sommer
6,665,222 B2 * 12/2003 Wright et al. ................ 365/194

FOREIGN PATENT DOCUMENTS

| JP | 10-107097 A | 4/1998 |
| JP | 2001-84800 | 3/2001 |
| JP | 2001-101896 A | 4/2001 |
| KR | 2000-00009900 | 1/2000 |
| KR | 2003-0037968 | 5/2003 |

\* cited by examiner

*Primary Examiner*—Son Dinh
(74) *Attorney, Agent, or Firm*—McDermott Will & Emery LLP

(57) ABSTRACT

An apparatus for detecting a defect of a data transfer line in a semiconductor memory device, including a data transfer unit for transferring data between a local I/O line and a global I/O line; a data transfer controller for controlling the data transfer unit by generating a read signal, a write signal, and a local I/O line reset signal; a test mode controller for preventing an activation of the read signal, a column select signal and the local I/O line reset signal based on a test mode signal; a first temporary data storage for storing data of the global I/O line; and a second temporary data storage for storing data of the local I/O line.

19 Claims, 6 Drawing Sheets

SEMICONDUCTOR MEMORY DEVICE

FIELD OF THE INVENTION

The present invention relates to a semiconductor memory device; and, more particularly, to an apparatus for detecting a defect of a data line in a semiconductor memory device.

DESCRIPTION OF RELATED ART

A dynamic random access memory (DRAM) is a typical semiconductor memory device that inputs and outputs data in synchronization with an external clock (CLK). As the DRAM is required to process much more data per unit time, an external clock frequency of DRAM also increases. Internal circuits of the DRAM become more diverse and complicated. Therefore, when a designed memory device is produced, a defect analysis is more difficult than ever. The term "defect" means that a written data is not normally read from a memory.

Data may be abnormally output by various causes, including a defect of DRAM memory cell itself, an error during an operation of amplifying cell data, an error during an operation of transferring a normally amplified cell data, and an error in logic configurations.

Specifically, an error of a logic part requiring synchronization with the external clock and margin failure often occurs in high-speed devices. A relatively great amount of time may be required to detect where these defects occur, which can delay product development.

FIG. 1 is a block diagram of a conventional semiconductor memory device.

The conventional semiconductor memory device includes a state machine 101, a decoder 103, a cell core 105, a first data transfer controller 107, a first data transfer unit 109, a second data transfer unit 111, a second data transfer controller 113, a local input/output (I/O) line LIO, a global I/O line GIO, and a data pin 115.

The state machine 101 receives an external clock CLK, a column address strobe signal /CAS, and a row address strobe signal /RAS to determine an internal operation of the semiconductor memory device. The decoder 103 selects a memory cell in response to signals RASACT, CASACT and ADDRESS output from the state machine 101. The cell core 105 has a plurality of memory cells. The first data transfer controller 107 generates a read signal RDEN, a local I/O line reset signal LIORSTB, and a write signal WDEN in response to read/write commands READ and WRITE output from the state machine 101. The second data transfer controller 113 controls the second data transfer unit 111 in response to a signal output from the state machine 101. Data between the memory cells of the cell core 105 hand the first data transfer unit 109 are transferred through the local I/O line LIO, and data between the first data transfer unit 109 and the second data transfer unit 111 are transferred through the global I/O line GIO. The data pin 115 inputs and outputs data from/to an external circuit.

The first data transfer unit 109 includes a write receiver and driver, and a read amplifier and driver. The second data transfer unit 111 includes a read receiver and driver, a write amplifier and driver, and a data I/O path.

An operation of the conventional semiconductor memory device will be described below.

FIGS. 2A and 2B are timing diagrams of the conventional semiconductor memory device illustrated in FIG. 1.

Referring to FIG. 2A, in a write operation, write data are applied to the data pin 115 in response to the write command WRITE and the second data transfer unit 111 transfer the write data to the global I/O line GIO.

The local I/O line reset signal LIORSTB and the write signal WDEN output from the first data transfer controller 107 are deactivated and activated, respectively. This operation aims to transfer the write data to the local I/O line LIO.

The write data cause a potential difference in the local I/O lines LIO and LIOB in response to a rising edge of-the write signal WDEN.

When the potential difference is generated in the local I/O lines LIO and LIOB, a column select signal YI for driving a YI transistor is activated so that the potential difference is transferred to a bit line. The YI transistor is a transistor for connecting the bit line to the local I/O lines LIO and LIOB.

Then, the potential difference of the local I/O lines LIO and LIOB is equalized in response to a falling edge of the local I/O line reset signal LIORSTB. Through these procedures, the operation of transferring the write data to the memory cell of the cell core 105 is finished.

Referring to FIG. 2B, in a read operation, the local I/O line reset signal LIORSTB is deactivated and the column select signal YI is activated in response to the read command READ, so that the YI transistor is driven. Therefore, read data stored in the memory cell of the cell core 105 are transferred to the local I/O lines LIO and LIOB. That is, a potential difference is generated.

When the read signal RDEN is activated, the potential difference of the local I/O lines LIO and LIOB is transferred to the global I/O line and output through the data pin 115.

As described above, the conventional memory device writes data to the cell core 105 through the data pin 115, and reads data from the cell core 105 and outputs the read data through the data pin 115 to the external circuit.

To detect a defect of the data transfer lines, a test is performed on the assumption that there are no defects in the cell core 105.

However, various defects occur in the cell core 105 because the cell core 105 is the finest and minutest part in the semiconductor memory device. Therefore, the defect of the cell core 105 makes it difficult to detect the defective data transfer lines that operate under control of a complicated timing.

The defect detection of the data transfer lines occurs if the read data attain an abnormal state during an operation of inspecting a transfer state using normal read data (data transferred from the memory cell to the external circuit). If the data transfer line is tested using abnormal read data, it is difficult to correctly detect the defect of the data transfer lines.

SUMMARY OF THE INVENTION

It is, therefore, an object of the present invention to provide a semiconductor memory device that can detect a defect of a data transfer line, regardless of a defect in a cell core with memory cells.

It is another object of the present invention to provide a semiconductor memory device that can detect a defect between a data pin and local I/O lines.

It is a further object of the present invention to provide a semiconductor memory device that can detect a defect between a data pin and global I/O lines.

In accordance with an aspect of the present invention, there is provided an apparatus for detecting a defect of a data transfer line in a semiconductor memory device, including: a data transfer unit for transferring data between a local I/O line and a global I/O line; a data transfer controller for controlling the data transfer unit by generating a read signal, a write signal, and a local I/O line reset signal; a test mode controller for preventing an activation of the read signal, a column select signal and the local I/O line reset signal based on a test mode signal; a first temporary data storage for storing data located in the global I/O line; and a second temporary data storage for storing data located in the local I/O line.

In accordance with another aspect of the present invention, there is provided a semiconductor memory device for detecting a defect of a data transfer line, including: a data transfer unit for transferring data between a local I/O line and a global I/O line; a data transfer controller for controlling the data transfer unit by generating a read signal and a write signal; a test mode controller for preventing an activation of the read signal based on a test mode signal; and a temporary data storage for storing data located in the global I/O line.

In accordance with a further aspect of the present invention, there is provided a semiconductor memory device for detecting a defect of a data transfer line, including: a data transfer unit for transferring data between a local I/O line and a global I/O line; a data transfer controller for controlling the data transfer unit by generating a local I/O line reset signal; a test mode controller for preventing an activation of a column select signal and the local I/O line, reset signal in response to a test mode signal; a first temporary data storage for storing data located in the global I/O line; and a second temporary data storage for storing data located in the local I/O line.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device for detecting a defect of a data transfer line in accordance with exemplary embodiments of the present invention will be described in detail with reference to the accompanying drawings.

Figure 1:
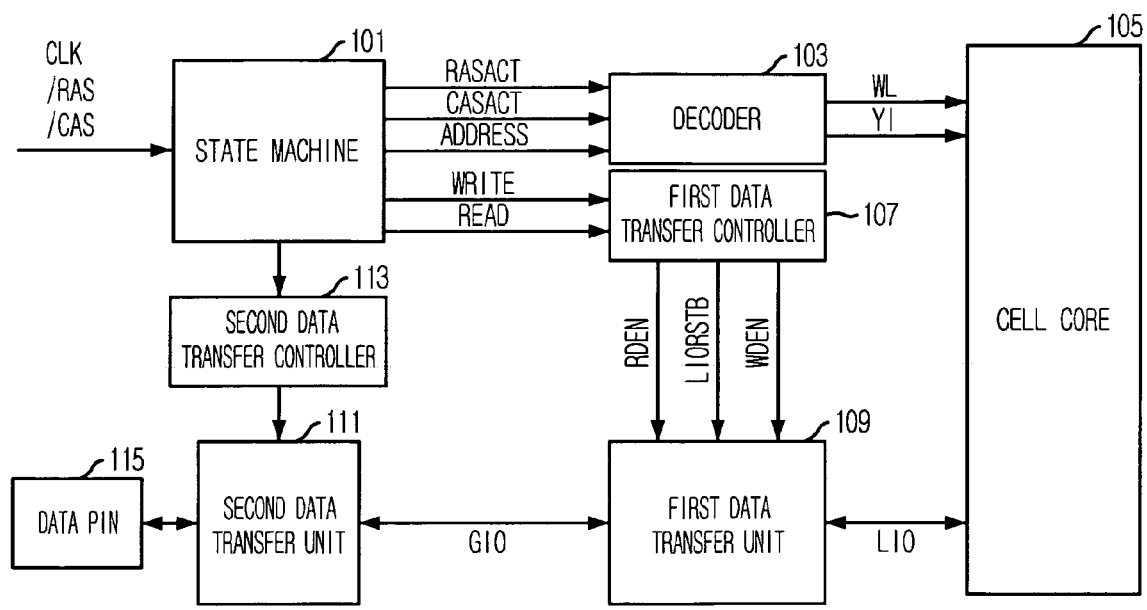
FIG. 1 is a block diagram of a conventional semiconductor memory device.
Figure 2A:
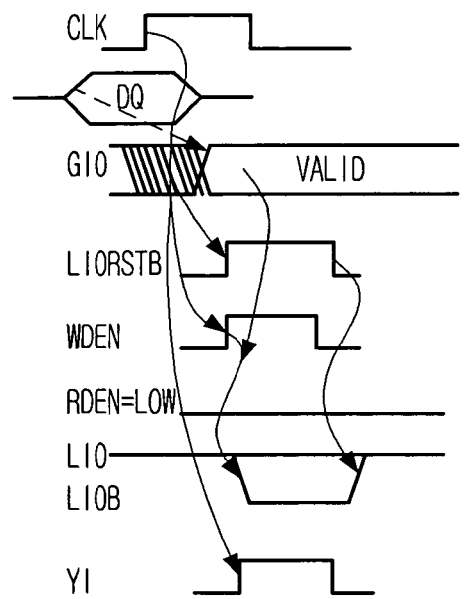
FIGS. 2A and 2B are timing diagrams of the semiconductor memory device illustrated in FIG. 1.
Figure 2B:
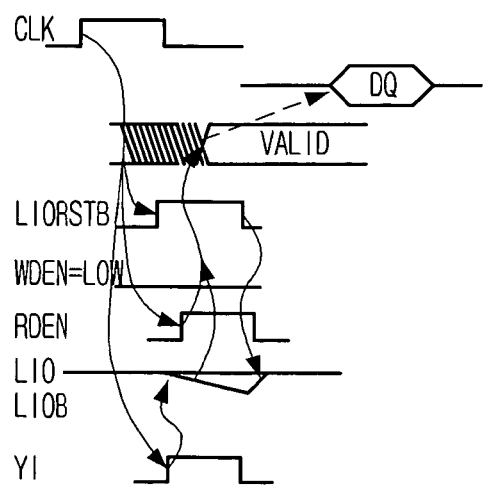
Figure 3:
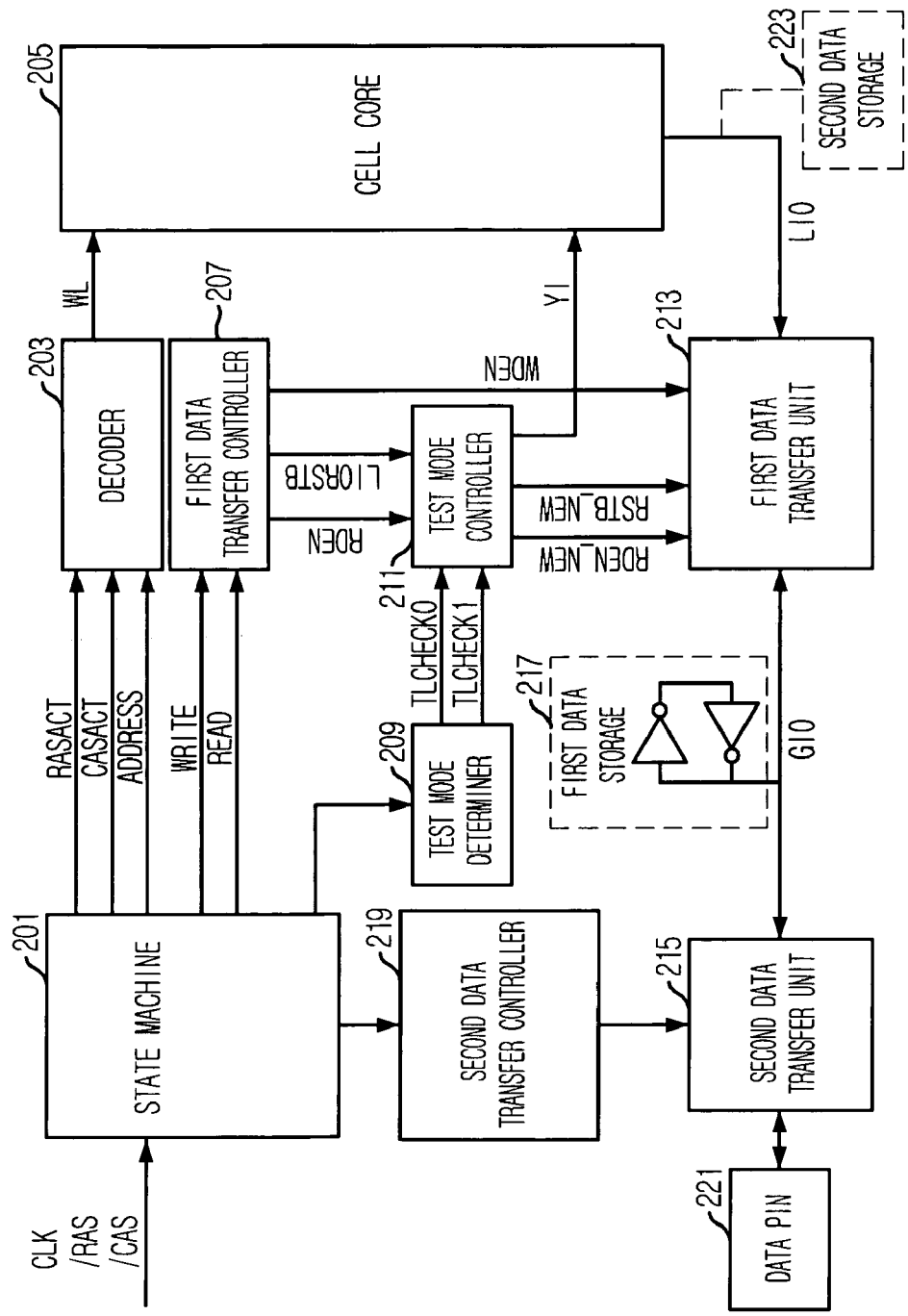
FIG. 3 is a block diagram of a semiconductor memory device in accordance with an embodiment of the present invention.

FIG. 3 is a block diagram for explaining a method for detecting a defect of a data transfer line in a semiconductor memory device in accordance with an embodiment of the present invention.

The semiconductor memory device includes a state machine 201, a decoder 203, a cell core 205, a first data transfer controller 207, a first data transfer unit 213, a second data transfer unit 215, a second data transfer controller 219, a local I/O line LIO, a global I/O line GIO, a data pin 221, a test mode determiner 209, a test mode controller 211, a first data storage 217, and a second data storage 223.

The state machine 201 receives an external clock CLK, a column address strobe signal /CAS, and a row address strobe signal /RAS to determine an internal operation of the semiconductor memory device. The decoder 203 selects a memory cell in response to signals RASACT, CASACT and ADDRESS output from the state machine 201. The cell core 205 has a plurality of memory cells. The first data transfer controller 207 generates a read signal RDEN, a local I/O line reset signal LIORSTB, and a write signal WDEN in response to read/write commands READ and WRITE output from the state machine 201. The second data transfer controller 219 controls the second data transfer unit 215 in response to a signal output from the state machine 201. Data between the memory cells of the cell core 205 and the first data transfer unit 213 are transferred through the local I/O line LIO, and data between the first data transfer unit 213 and the second data transfer unit 215 are transferred through the global I/O line GIO. The data pin 221 inputs and outputs data from/to an external circuit. The test mode determiner 209 determines a test mode entry in response to a signal output from the state machine 201. The test mode controller 211 controls the first data transfer unit 213 in response to first and second test mode signals TLCHECK0 and TLCHECK1 output from the test mode determiner 209. The first data storage 217 is located in the global I/O line GIO to temporarily store write data (data transferred from the external circuit to the memory cell), and the second data storage 223 is located in the local I/O line LIO to temporarily store the write data.

The first data transfer unit 213 includes a write receiver and driver, and a read amplifier and driver. The second data transfer unit 215 includes a read receiver and driver, a write amplifier and driver, and a data I/O path.

The first-data storage 217 and the second data storage 223 may be optionally provided according to where detection is to be made of the defect of the data transfer lines in the data pin 221. That is, the first data storage 217 is used when the transfer state of the second data transfer unit 215 is inspected, and the second data storage 223 is used when the transfer states of the first and second data transfer units 213 and 215 are inspected.

The first data storage 217 can be implemented with an inverter latch circuit, and the second data storage 223 can be implemented with the local I/O line LIO themselves so as to increase degree of integration.

Hereinafter, an operation of the semiconductor memory device when the first data storage 217 is used will be described below.

When the write data are input through the data pin 221, the test mode determiner 209 outputs the first test mode signal TLCHECK0 so as to select a temporary storage. At this point, the first test mode signal TLCHECK0 is a signal for selecting the first data storage 217 as the storage for temporarily storing the write data.

The write data are temporarily stored in the first data storage 217 through the second data transfer unit 215. At this point, a defect detection is performed on a circuit located before the first data storage 217. That is, whether the write data are normally transferred is monitored.

Then, the write data are written to the memory cell of the cell core 205 through the first data transfer unit 213.

The read data from the memory cell are transferred to the first data transfer unit 213 through the local I/O line LIO. At this point, the test mode controller 211 receives the first test mode signal TLCHECK0 and prevents the read data from being transferred to the global I/O line GIO. The test mode controller 211 prevents the activation of the read signal RDEN, so that the read data are not transferred.

The write data temporarily stored in the first data storage 217 are transferred to the second data transfer unit 215 and finally output through the data pin 221 to the external circuit.

In summary, the write data are temporarily stored in the first data storage 217 during the write operation, and the read data output from the memory cell during the read operation are not transferred by the first data transfer unit 213. Thereafter, the write data temporarily stored in the first data storage 217 are transferred to the external circuit. That is, the defect is detected by monitoring the data transfer between the data pin 221 and the second data transfer unit 215 during the write operation and the read operation.

Next, an operation of the semiconductor memory device when the second data storage 213 is used will be described below.

When the write data are input through the data pin 221, the test mode determiner 209 outputs the second test mode signal TLCHECK1 so as to select a temporary storage. At this point, the second test mode signal TLCHECK1 is a signal for selecting the second data storage 213 as the storage for temporarily storing the write data.

The write data are transferred through the second data transfer unit 215 and the first data transfer unit 213 and temporarily stored in the second data storage 223 located in the local I/O line LIO. At this point, a defect detection is performed on a data transfer circuit located before the second data storage 223. Then, the write data are written to the memory cell of the cell core 205.

The test mode controller 211 prevents the activation of the local I/O line reset signal LIORSTB, so that the write data is temporarily stored in the local I/O line LIO. That is, the write data are temporarily stored in the second data storage 223.

In a read operation, the read data are loaded on the bit line. At this point, the test mode controller 211 prevents the activation of a column select signal YI used to drive the YI transistor, so that the read data from the memory cell are not transferred to the local I/O line LIO.

Therefore, the read data according to a subsequent read operation use the write data temporarily stored in the second data storage 211.

In summary, the write data are temporarily stored in the second data storage 223 during the write operation, and the read data output from the memory cell during the read operation are not transferred by disabling the driving of the YI transistor. Thereafter, the write data temporarily stored in the second data storage 223 are transferred to the external circuit. That is, the defect is detected by monitoring the data transfer between the data pin 221 and the first data transfer unit 213 during the write operation and the read operation.

Consequently, the first data storage 217 and the second data storage 223 are used as the temporary storage for the write data. While the transfer of the read data output from the cell core 205 is prevented, the defect of the data transfer lines is detected using the write data during the read operation. That is, the defect of the data transfer lines can be detected, regardless of the cell core 205 where the defects often occur.

Figure 4:
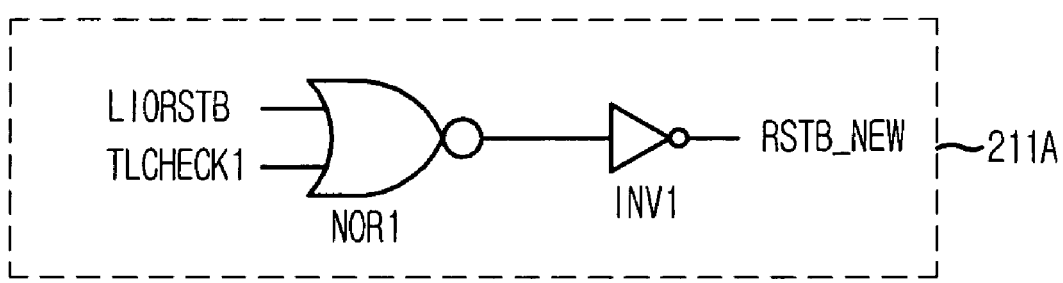
FIG. 4 is a circuit diagram of a test mode controller illustrated in FIG. 3.
Figure 4:
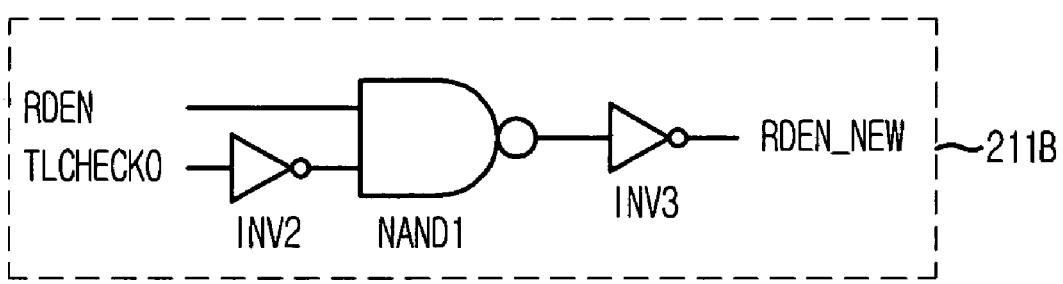

FIG. 4 is a circuit diagram of the test mode controller 211 illustrated in FIG. 3.

Specifically, the test mode controller 211 includes a first test mode controller 211A for preventing the local I/O line LIO from being reset, and a second test mode controller 211B for preventing the activation of the read signal RDEN.

The first test mode controller 211A can be implemented with a NOR gate NOR1 and a first inverter INV1. The NOR gate NOR1 receives the local I/O line reset signal LIORSTB and the second test mode signal TLCHECK1, and the first inverter INV1 inverts an output signal of the NOR gate NOR1 to output a new local I/O line reset signal RSTB_NEW controlled by the second test mode signal TLCHECK1.

The second test mode controller 211B can be implemented with a second inverter INV2, a NAND gate NAND1, and a third inverter INV3. The second inverter INV2 inverts the first test mode signal TLCHECK0, and the NAND gate NAND1 receives the read signal RDEN and an output signal of the second inverter INV2. The third inverter INV3 inverts an output signal of the NAND gate NAND1 to output a new read signal RDEN_NEW controlled by the first test mode signal TLCHECK0.

Figure 5A:
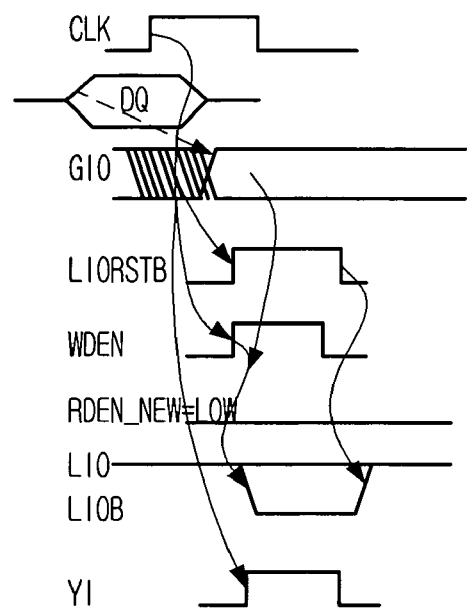
FIGS. 5A and 5B are timing diagrams of the semiconductor memory device that uses a first data storage as a temporary storage.
Figure 5B:
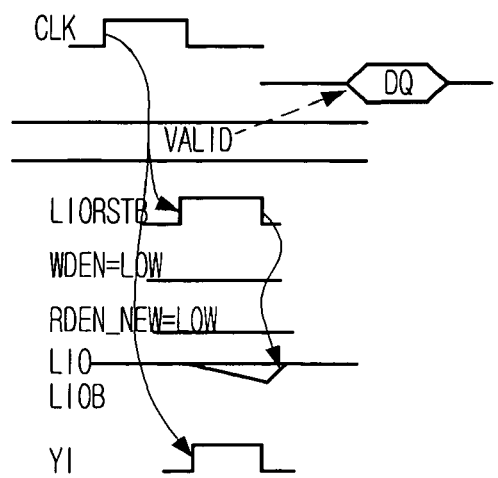

FIGS. 5A and 5B are timing diagrams of the semiconductor memory device that uses the first data storage 217 as the temporary storage.

Referring to FIG. 5A, in the write operation, the write data are applied to the data pin 221 in response to the write command WRITE and the second data transfer unit 215 transfers the write data to the global I/O line GIO. At this point, the test mode determiner 209 outputs the first test mode signal TLCHECK0, so that the first data storage 217 is selected. Therefore, the write data are temporarily stored in the first data storage 217 located in the global I/O line GIO.

Then, the local I/O line reset signal LIORSTB and the write signal WDEN output from the first data transfer controller 213 are deactivated and activated, respectively. This operation aims to transfer the write data to the local I/O line.

At this point, the write data cause the potential difference in the local I/O lines LIO and LIOB in response to the rising edge of the write signal WDEN.

When the potential difference is generated in the local I/O lines LIO and LIOB, the column select signal YI for driving the YI transistor is activated so that the potential difference is transferred to the bit line. The YI transistor is a transistor for connecting the bit line to the local I/O lines LIO and LIOB.

Then, the potential difference of the local I/O lines LIO and LIOB is equalized in response to the falling edge of the local I/O line reset signal LIORSTB. Through these procedures, the operation of transferring the write data to the memory cell of the cell core 205 is finished.

Referring to FIG. 5B, in the read operation, the local I/O line reset signal LIORSTB is deactivated and the column select signal YI is activated in response to the read command READ, so that the YI transistor is driven. Therefore, read data stored in the memory cell of the cell core 205 are transferred to the local I/O lines LIO and LIOB. That is, a potential difference is generated.

Then, the test mode controller 211 deactivates the read signal RDEN output from the first data transfer controller 207 and transfers the deactivated new read signal RDEN_NEW to the first data transfer unit 213. That is, the read data loaded on the local I/O line are not transferred to the global I/O line GIO.

Thereafter, the write data temporarily stored in the first data storage 217 are output to the external circuit.

Figure 6A:
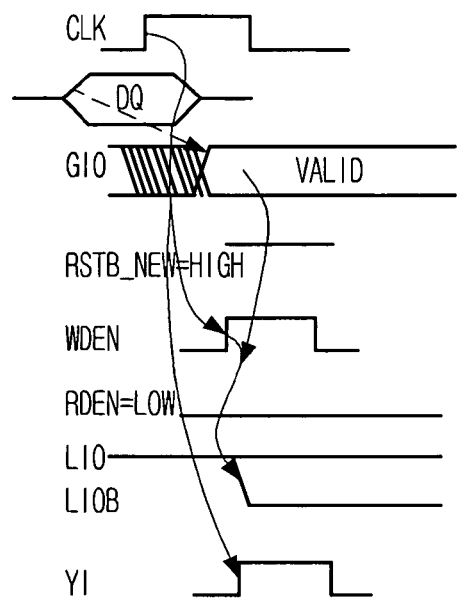
FIGS. 6A and 6B are timing diagrams of the semiconductor memory device that uses a second data storage as a temporary storage.
Figure 6B:
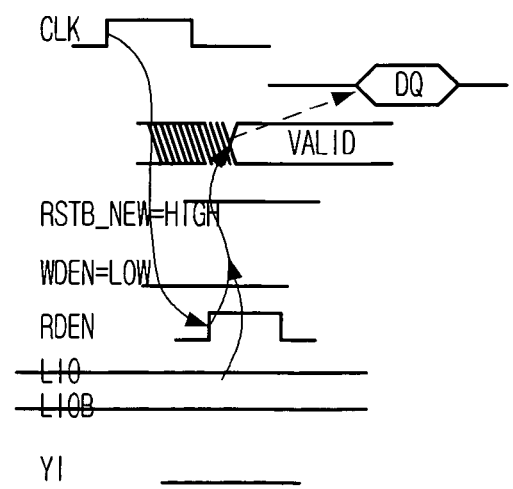

FIGS. 6A and 6B are timing diagrams of the semiconductor memory device that uses the second data storage 223 as the temporary storage.

Referring to FIG. 6A, in the write operation, the write data are applied to the data pin 221 in response to the write command WRITE and the second data transfer unit 215 transfers the write data to the global I/O line GIO.

The local I/O line reset signal LIORSTB and the write signal WDEN output from the first data transfer controller 213 are deactivated and activated, respectively. This operation aims to transfer the write data to the local I/O line.

At this point, the write data cause the potential difference in the local I/O lines LIO and LIOB in response to the rising edge of the write signal WDEN.

When the potential difference is generated in the local I/O lines LIO and LIOB, the column select signal YI for driving the YI transistor is activated so that the potential difference is transferred to the bit line.

At this point, the test mode determiner 209 outputs the second test mode signal TLCHECK1 and controls the test mode controller 211. Therefore, the test mode controller 211 prevents the local I/O line reset signal LIORSTB from being activated, so that the write data are not eliminated from the local I/O line LIO. That is, the write data are temporarily stored in the second data storage 223.

Referring to FIG. 6B, in the read operation, the test mode controller 211 prevents the activation of the column select signal (YI), so that the read data from the memory cell are not transferred to the local I/O line.

Then, the write data temporarily stored in the second data storage 223 are transferred to the first data transfer unit 213 and output to the external circuit through the global I/O line GIO, the second data transfer unit 215 and the data pin 221.

As described above, the first and second data storages 217 and 223 are used as the temporary storage for the write data. While the transfer of the read data output form the cell core 205 is prevented, the defect of the data transfer lines is detected using the write data during the read operation. That is, the defect of the data transfer lines can be detected, regardless of the cell core 205 where the defects often occur.

In the aforementioned embodiments, the kinds and arrangements of the logics have been provided for the case where the input signals and output signals are all high active signals. Therefore, when the active polarities of the signals are changed, the logic implementations will be also modified. The number of these implementations is extensive and their modifications can be easily derived by those skilled in the art.

In addition, although the test mode determiner 209, the test mode controller 211, and the first data storage 217 have been implemented using multiple logic circuits, the present invention is not limited to them.

The present application contains subject matter related to Korean patent application Nos. 2005-90859 & 2006-49005, filed in the Korean Intellectual Property Office on Sep. 28, 2005 & May 30, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An apparatus for detecting a defect of a data transfer line in a semiconductor memory device, comprising:
   a data transfer unit for transferring data between a local I/O line and a global I/O line;
   a data transfer controller for controlling the data transfer unit by generating a read signal, a write signal, and a local I/O line reset signal;
   a test mode controller for preventing an activation of the read signal, a column select signal and the local I/O line reset signal based on a test mode signal;
   a first temporary data storage for storing data of the global I/O line; and
   a second temporary data storage for storing data of the local I/O line.

2. The apparatus of claim 1, further comprising:
   a test mode determiner for generating the test mode signal; and
   a column decoder for outputting the column select signal to control a data transfer between a memory cell and the local I/O line.

3. The apparatus of claim 1, wherein the test mode signal includes a first test mode signal for selecting the first temporary data storage and a second test mode signal for selecting the second temporary data storage.

4. The apparatus of claim 3, wherein the test mode controller includes:
   a first deactivating unit for preventing the activation of the read signal;
   a second deactivating unit for preventing the activation of the column select signal; and
   a third deactivating unit for preventing the activation of the local I/O line reset signal.

5. The apparatus of claim 4, wherein the first deactivating unit includes:
   a first inverter for inverting the first test mode signal;
   a logic gate for performing a NAND operation of the read signal and an output signal of the first inverter; and
   a second inverter for inverting an output signal of the logic gate.

6. The apparatus of claim 4, wherein the second deactivating unit includes:
   a logic gate for performing a NOR operation of the second test mode signal and the local I/O line reset signal; and
   an inverter for inverting an output signal of the logic gate.

7. The apparatus of claim 1, wherein the first temporary data storage and the second temporary data storage are optionally provided according to a defect detection area of the data transfer line.

8. The apparatus of claim 1, wherein the first temporary data storage is implemented with an inverter latch circuit.

9. The apparatus of claim 1, wherein the second temporary data storage includes the local I/O line.

10. A semiconductor memory device for detecting a defect of a data transfer line, comprising:
    a data transfer unit for transferring data between a local I/O line and a global I/O line;
    a data transfer controller for controlling the data transfer unit by generating a read signal and a write signal;
    a test mode controller for preventing an activation of the read signal based on a test mode signal; and
    a temporary data storage for storing data located in the global I/O line.

11. The semiconductor memory device of claim 10, wherein the test mode controller includes:
    a first inverter for inverting the test mode signal;
    a logic gate for performing a NAND operation of the read signal and an output signal of the first inverter; and
    a second inverter for inverting an output signal of the logic gate.

12. The semiconductor memory device of claim 10, wherein the temporary data storage is implemented with an inverter latch circuit.

13. A semiconductor memory device for detecting a defect of a data transfer line, comprising:
   a data transfer unit for transferring data between a local I/O line and a global I/O line;
   a data transfer controller for controlling the data transfer unit by generating a local I/O line reset signal;
   a test mode controller for preventing an activation of a column select signal and the local I/O line reset signal in response to a test mode signal;
   a first temporary data storage for storing data located in the global I/O line; and
   a second temporary data storage for storing data located in the local I/O line.

14. The semiconductor memory device of claim 13, further comprising:
   a test mode determiner for generating the test mode signal; and
   a column decoder for outputting the column select signal to control a data transfer between a memory cell and the local I/O line.

15. The semiconductor memory device of claim 13, wherein the test mode signal includes a first test mode signal for selecting the first temporary data storage and a second test mode signal for selecting the second temporary data storage.

16. The semiconductor memory device of claim 15, wherein the test mode controller includes:
   a first deactivating unit for preventing the activation of the column select signal; and
   a second deactivating unit for preventing the activation of the local I/O line reset signal.

17. The semiconductor memory device of claim 16, wherein the second deactivating unit includes:
   a logic gate, inputs of the logic gate coupled to the second test mode signal and the local I/O line reset signal; and
   an inverter for inverting an output signal of the logic gate.

18. The semiconductor memory device of claim 15, wherein the first temporary data storage is implemented with an inverter latch circuit.

19. The semiconductor memory device of claim 15, wherein the second temporary data storage includes the local I/O line.

\* \* \* \* \*